(12) United States Patent
Cao et al.

(10) Patent No.: US 9,123,775 B2
(45) Date of Patent: Sep. 1, 2015

(54) ARRAY SUBSTRATE, METHOD FOR MANUFACTURING THE SAME AND DISPLAY DEVICE

(71) Applicant: BOE TECHNOLOGY GROUP CO., LTD., Beijing (CN)

(72) Inventors: Zhanfeng Cao, Beijing (CN); Xiaoyang Tong, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/878,887

(22) PCT Filed: Nov. 7, 2012

(86) PCT No.: PCT/CN2012/084247
§ 371 (c)(1),
(2) Date: Apr. 11, 2013

(87) PCT Pub. No.: WO2013/102370
PCT Pub. Date: Jul. 11, 2013

(65) Prior Publication Data
US 2014/0054620 A1    Feb. 27, 2014

(30) Foreign Application Priority Data

Jan. 4, 2012  (CN) .......................... 2012 1 0001279

(51) Int. Cl.
*H01L 21/311*    (2006.01)
*H01L 21/768*    (2006.01)
(Continued)

(52) U.S. Cl.
CPC ........ *H01L 21/76802* (2013.01); *H01L 21/308* (2013.01); *H01L 21/31116* (2013.01);
(Continued)

(58) Field of Classification Search
CPC ............ H01L 21/308; H01L 21/31116; H01L 21/31138; H01L 27/1244; H01L 21/76802; H01L 27/1259; G02F 2201/40; F02F 1/136227; G03F 7/00

USPC ......... 438/8, 9, 689, 700, 706, 707, 710, 711, 438/714, 723–725
See application file for complete search history.

(56) References Cited

U.S. PATENT DOCUMENTS 5,057,187 A * 10/1991 Shinagawa et al. ........... 438/725
6,440,864 B1 * 8/2002 Kropewnicki et al. ....... 438/710
(Continued)

FOREIGN PATENT DOCUMENTS

| CN | 1358325 A | 7/2002 |
| CN | 101015042 A | 8/2007 |

(Continued)

OTHER PUBLICATIONS

Quirk et al. Semiconductor Manufacturing Tecyhnology. 2001, p. 443.*
(Continued)

*Primary Examiner* — Galina Yushina
(74) *Attorney, Agent, or Firm* — Ladas & Parry LLP

(57) ABSTRACT

Embodiments of the present invention provide an array substrate, a method for manufacturing the same and a display device. The method for manufacturing a thin film transistor array substrate comprises: forming a passivation layer and a resin layer on a substrate in sequence; removing a part of the resin layer through a patterning process, so as to form a resin-layer via hole passing through the resin layer; etching the passivation layer under the resin-layer via hole, so as to form a via hole passing through the resin layer and the passivation layer; treating the via hole with an etching process, so that a sidewall at the resin layer and a sidewall at the passivation layer for the via hole smoothly adjoin.

1 Claim, 1 Drawing Sheet

(51) Int. Cl.
*H01L 21/308* (2006.01)
*H01L 27/12* (2006.01)
*G02F 1/1362* (2006.01)

(52) U.S. Cl.
CPC ........ *H01L21/31138* (2013.01); *H01L 27/124* (2013.01); *H01L 27/1244* (2013.01); *H01L 27/1259* (2013.01); *G02F 1/136227* (2013.01); *G02F 2201/40* (2013.01)

(56) References Cited

U.S. PATENT DOCUMENTS

| | | | |
|---|---|---|---|
| 6,465,159 | B1 | 10/2002 | Ni et al. |
| 7,268,366 | B2 | 9/2007 | Moon |
| 7,309,448 | B2 * | 12/2007 | Chae et al. ............ 216/66 |
| 2002/0106839 | A1 * | 8/2002 | Tsujimura et al. ........... 438/149 |
| 2006/0051965 | A1 | 3/2006 | Edelberg et al. |
| 2007/0002212 | A1 * | 1/2007 | Chen ................... 349/73 |
| 2008/0299777 | A1 * | 12/2008 | Tosaka ................ 438/724 |
| 2011/0089421 | A1 * | 4/2011 | Choi et al. ............. 257/59 |

FOREIGN PATENT DOCUMENTS

| | | |
|---|---|---|
| CN | 101866877 A | 10/2010 |
| CN | 102044556 A | 5/2011 |
| CN | 102651370 A | 8/2012 |
| TW | 531794 B | 5/2003 |

OTHER PUBLICATIONS

First Chinese Office Action dated Feb. 11, 2014; Appln. No. 201210001279.6.
International Search Report maild Feb. 28, 2013; PCT/CN2012/084247.
International Preliminary Report on Patentability Issued Jul. 8, 2014 Appln. No. PCT/CN2012/084247.
Second Chinese Office Action Appln. No. 201210001279.6; Issued Aug. 14, 2014.

* cited by examiner

ARRAY SUBSTRATE, METHOD FOR MANUFACTURING THE SAME AND DISPLAY DEVICE

FIELD OF THE INVENTION

Embodiments of the present invention relate to an array substrate, a method for manufacturing the same and a display device including the array substrate.

BACKGROUND

For a Thin Film Transistor-Liquid Crystal Display (TFT-LCD) and an Organic Light-Emitting Diode (OLED) display device, the quality of a TFT array substrate is especially important.

In an existing manufacturing method of the TFT array substrate, it is necessary that a passivation layer be firstly deposited on a substrate on which a TFT structure has already been formed. Generally, in order to enhance the aperture ratio of products, it is also necessary that a resin layer be coated on a surface of the passivation layer, and then a via hole be formed over a drain electrode of the TFT by using a patterning process so as to be connected to a pixel electrode. During formation of the via hole passing through the above resin layer and the passivation layer, because etch rate of a resin layer 12 is much smaller than that of a passivation layer 11, a lateral etch distance of the passivation layer 11 is larger than that of the resin layer 12. As shown in FIG. 1, after the via hole is formed, an undercut occurs in the passivation layer 11, and an internal step shape (as denoted by region A in FIG. 1) is formed between the resin layer 12 and the passivation layer 12 that have been etched. This will result in the fact that in a subsequent procedure, a pixel electrode will be fractured upon deposition of a pixel electrode layer.

As can be seen, it is hard to solve a problem that after a via hole is formed, an internal step shape is formed between a resin-layer sidewall and a passivation-layer sidewall of the via hole with the existing manufacturing method of the TFT array substrate. Such a problem will lead to fracture of a pixel electrode and degradation of yield of products.

SUMMARY

According to an embodiment of the present invention, there is provided a method for manufacturing a thin film transistor array substrate, comprising: forming a passivation layer and a resin layer on a substrate in sequence; removing a part of the resin layer through a patterning process, so as to form a resin-layer via hole passing through the resin layer; etching the passivation layer under the resin-layer via hole, so as to form a via hole passing through the resin layer and the passivation layer; treating the via hole with an etching process, so that a sidewall at the resin layer and a sidewall at the passivation layer for the via hole smoothly adjoin.

According to another embodiment of the present invention, there is provided a thin film transistor array substrate, comprising: a substrate; a passivation layer and a resin layer stacked on the substrate in sequence, wherein, in the passivation layer and the resin layer, there is a via hole passing through the passivation layer and the resin layer, and a sidewall at the resin layer and a sidewall at the passivation layer for the via hole smoothly adjoin.

According to still another embodiment of the present invention, there is provided a display device, comprising the array substrate as stated in the embodiment of the invention.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
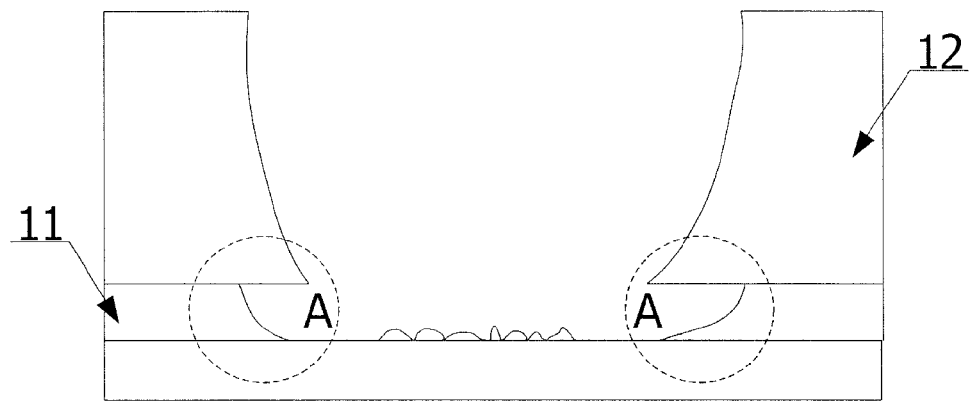
FIG. 1 is a schematic view showing a structure of a via hole in prior art.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

According to an embodiment of the present invention, there is provided a method for manufacturing a TFT array substrate, comprising:

S201: a passivation layer and a resin layer are formed on a substrate in sequence, and a part of the resin layer is removed through a patterning process, so as to form a resin-layer via hole passing through the resin layer.

For example, before formation of the passivation layer and the resin layer, at least one of a thin film transistor, a gate line, a gate line leading wire, a data line, a data line leading wire and other components has already been formed on the substrate. However, embodiments of the invention are not limited thereto.

S202: the passivation layer under the resin-layer via hole is etched, so as to form a via hole passing through the resin layer and the passivation layer.

S203: the via hole is treated with an etching process, so that a sidewall at the resin layer and a sidewall at the passivation layer for the via hole smoothly adjoin.

With respect to the above step S202, the via hole passing through the resin layer and the passivation layer can be disposed over a drain electrode of the thin film transistor, the gate line leading wire or the data line leading wire. After formation of the via hole, the above components can be exposed by the via hole. Further, the via hole can be disposed in at least one of a pixel region and a peripheral leading wire region of the thin film transistor substrate.

According to the method for manufacturing the TFT array substrate provided by the embodiment of the invention, the sidewall at the resin layer and the sidewall at the passivation layer for the via hole smoothly adjoin by means of treating the via hole with the etching process, to thereby solve a problem in the prior art that an internal step shape is formed between a resin-layer sidewall and a passivation-layer sidewall of a via hole after the via hole is formed, and fracture of a pixel electrode and degradation of yield of products occur accordingly. Thus, the quality of the display device is improved greatly.

According to another embodiment of the invention, there is provided a method for manufacturing a TFT array substrate, comprising:

S301: a gate metal layer, a gate insulating layer, an active layer, a source and drain metal layer are formed on a transparent substrate in sequence. The gate metal layer may include a gate line and a gate electrode of a TFT, and the source and drain metal layer may include a data line and a source electrode and a drain electrode of the TFT.

For example, regarding the process of forming the gate metal layer, the gate insulating layer, the active layer and the source and drain metal layer on the transparent substrate in sequence, we may refer to prior art, in which, with a patterning process, a gate metal layer, a gate insulating layer, an active layer and a source and drain metal layer are sequentially formed through procedures of exposure, development and etching.

S302: a passivation layer and a resin layer are fabricated on the source and drain metal layer.

For example, the passivation layer can be deposited on the transparent substrate on which the gate metal layer, the gate insulating layer, the active layer and the source and drain metal layer have been formed by means of chemical vapor deposition, and material for it is generally silicon nitride, silicon oxide or a transparent, organic resin material. A resin is coated on the transparent substrate on which the passivation layer has been deposited so as to form the resin layer. In the embodiment, the resin layer is of a photosensitive resin.

S303: the resin layer is exposed and developed by using a patterning process, so as to form a resin-layer via hole.

S304: the residual resin at the resin-layer via hole is removed by using an ashing process.

For example, it is possible that in an environment of a fluorine containing gas and an oxygen gas, the residual resin in the resin-layer via hole is removed by using the ashing process. In the ashing process, in order to increase ashing rate of the resin layer so that the ashing is conducted at the shortest time, the mass ratio of oxygen gas to the fluorine containing gas may be in the range of 8:1-12:1. For example, the flow rate of the fluorine containing gas may be in the range of 20-100 sccm, and the flow rate of oxygen gas may be in the range of 500-1000 sccm.

With such a method, the residual resin in the resin-layer via hole is removed. This can make the passivation layer under the resin-layer via hole be removed fully, so that a pixel electrode layer can be well attached to the drain electrode of the TFT or a leading wire at the bottom of the via hole. Thus, a problem in prior art that etch residual, which occurs during etching of a via hole, causes poor contact between a pixel electrode layer and a drain electrode of a TFT or a leading wire at the bottom of the via hole is solved.

S305, the passivation layer under the resin-layer via hole is etched to form a via hole passing through the resin layer and the passivation layer, so as to expose the drain electrode of the TFT, the leading wire or the like.

For example, it is possible that in an environment of a fluorine containing gas and an oxygen gas, the passivation layer under the resin-layer via hole is etched (for example, by dry etching). In order to increase etch rate of the passivation layer and reduce etching of the resin layer, the mass ratio of oxygen gas to the fluorine containing gas may be in the range of 1:3-1:1. For example, the flow rate of the fluorine containing gas may be in the range of 300-600 sccm, and the flow rate of oxygen gas may be in the range of 300-800 sccm. When it is required that the via hole be located in a pixel region, at the bottom of the via hole is the drain electrode of the TFT; and when it is required that the via hole be located in a peripheral leading wire region, at the bottom of the via hole is a gate line leading wire or a data line leading wire.

S306, the via hole is treated with an etching process, so that a sidewall at the resin layer and a sidewall at the passivation layer smoothly adjoin.

For example, it is possible that in an environment of a fluorine containing gas and an oxygen gas, the via hole is treated with an ashing process, so that the sidewall at the resin layer and the sidewall at the passivation layer smoothly adjoin. In order to increase ashing rate and reduce lateral etching of the passivation layer, the mass ratio of oxygen gas to the fluorine containing gas may be in the range of 15:1-25:1. For example, the flow rate of the fluorine containing gas may be in the range of 20-200 sccm, and the flow rate of oxygen gas may be in the range of 500-2000 sccm.

According to the method for manufacturing the TFT array substrate provided by the embodiment of the invention, the sidewall at the resin layer and the sidewall at the passivation layer for the via hole smoothly adjoin by means of treating the via hole with the etching process, to thereby solve a problem in the prior art that an internal step shape is formed between a resin-layer sidewall and a passivation-layer sidewall of a via hole after the via hole is formed, and fracture of a pixel electrode and degradation of yield of products occur accordingly. Thus, the quality of the display device is improved greatly. On the other hand, removing of the residual resin in the resin-layer via hole can make the passivation layer under the resin-layer via hole be removed fully, so that the pixel electrode layer can be well attached to the drain electrode of the TFT or the leading wire at the bottom of the via hole. Thus, a problem in prior art that etch residual, which occurs during etching of a via hole, causes poor contact between a pixel electrode layer and a drain electrode of a TFT or a leading wire at the bottom of the via hole is solved.

According to still another embodiment of the invention, there is provided a method for manufacturing a TFT array substrate, comprising:

S401: a gate metal layer, a gate insulating layer, an active layer, a source and drain metal layer are formed on a transparent substrate in sequence. The gate metal layer may include a gate line and a gate electrode of a TFT, and the source and drain metal layer may include a data line and a source electrode and a drain electrode of the TFT.

For example, regarding the process of forming the gate metal layer, the gate insulating layer, the active layer and the source and drain metal layer on the transparent substrate in sequence, we may refer to prior art, in which, with a patterning process, a gate metal layer, a gate insulating layer, an active layer and a source and drain metal layer are sequentially formed through procedures of exposure, development and etching.

S402: a passivation layer and a resin layer are fabricated on the source and drain metal layer.

For example, the passivation layer can be deposited on the transparent substrate on which the gate metal layer, the gate insulating layer, the active layer and the source and drain metal layer have been formed by means of chemical vapor deposition, and material for it is generally silicon nitride, silicon oxide or a transparent, organic resin material.

A resin is coated on the transparent substrate on which the passivation layer has been deposited so as to form the resin layer. In the embodiment, the resin layer is of a general transparent resin material which is not photosensitive.

S403: a resin-layer via hole is formed through etching by using a patterning process.

For example, the resin-layer via hole can be formed through etching by directly using an ashing process.

S404: the passivation layer under the resin-layer via hole is etched to form a via hole passing through the resin layer and the passivation layer, so as to expose the drain electrode of the TFT or a leading wire.

For example, it is possible that in an environment of a fluorine containing gas and an oxygen gas, the resin-layer via hole is treated with a patterning process, so as to expose the drain electrode of the TFT or the leading wire and form a via hole passing through the resin layer and the passivation layer. The mass ratio of oxygen gas to the fluorine containing gas may be in the range of 1:3-1:1. For example, the flow rate of the fluorine containing gas may be in the range of 300-600 sccm, and the flow rate of oxygen gas may be in the range of 300-800 sccm. When it is required that the via hole be located in a pixel region, at the bottom of the via hole is the drain electrode of the TFT; and when it is required that the via hole be located in a peripheral leading wire region, at the bottom of the via hole is a gate line leading wire and a data line leading wire.

S405, the via hole is treated with an etching process, so that a sidewall at the resin layer and a sidewall at the passivation layer smoothly adjoin.

For example, it is possible that in an environment of a fluorine containing gas and an oxygen gas, the via hole is treated with an ashing process, so that the sidewall at the resin layer and the sidewall at the passivation layer smoothly adjoin. The mass ratio of oxygen gas to the fluorine containing gas may be in the range of 15:1-25:1. For example, the flow rate of the fluorine containing gas may be in the range of 20-200 sccm, and the flow rate of oxygen gas may be in the range of 500-2000 sccm.

According to the method for manufacturing the TFT array substrate provided by the embodiment of the invention, the sidewall at the resin layer and the sidewall at the passivation layer for the via hole smoothly adjoin by means of treating the via hole with the etching process, to thereby solve a problem in prior art that an internal step shape is formed between a resin-layer sidewall and a passivation-layer sidewall of a via hole after the via hole is formed, and fracture of a pixel electrode and degradation of yield of products occur accordingly. Thus, the quality of the display device is improved largely.

Figure 2:
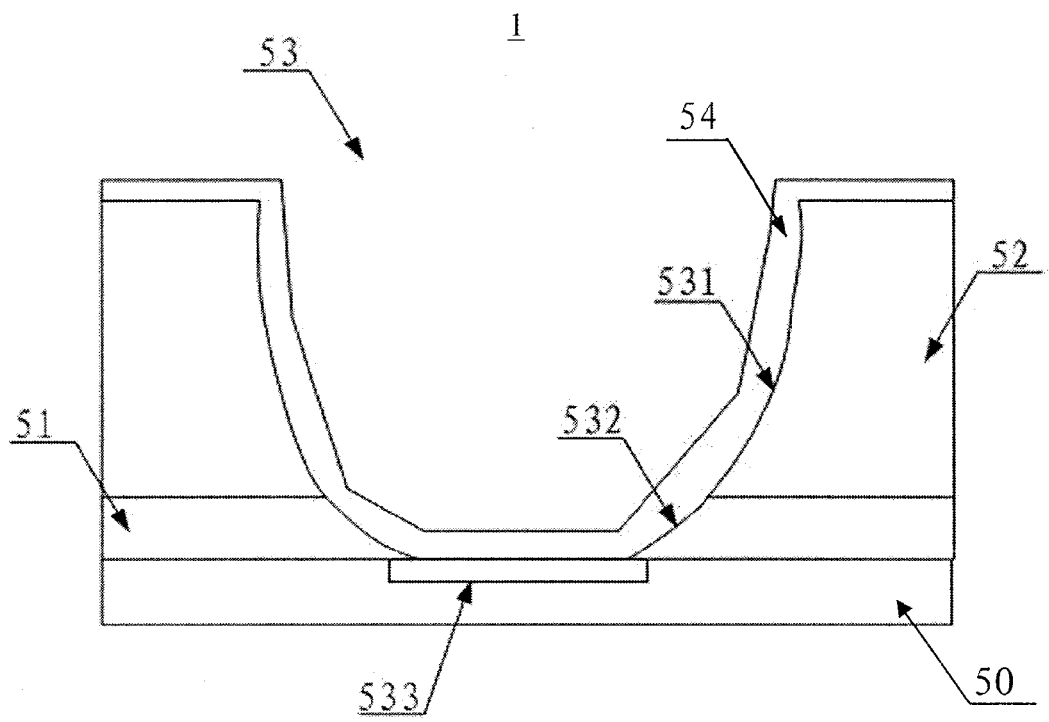
FIG. 2 is a schematic view showing a structure of a via hole for a TFT array substrate provided by an embodiment of the invention.

According to an embodiment of the invention, there is provided a TFT array substrate 1 fabricated with the use of the above methods. As shown in FIG. 2, it comprises: a substrate 50, and a passivation layer 51 and a resin layer 52 stacked on the substrate 50 in sequence. In the passivation layer 51 and the resin layer 52, there is a via hole 53 passing through the resin layer 52 and the passivation layer 51. A sidewall 531 at the resin layer and a sidewall 532 at the passivation layer for the via hole 53 smoothly adjoin.

The sidewall at the resin layer and the sidewall at the passivation layer for the via hole of the TFT array substrate provided by the embodiment of the invention smoothly adjoin, whereby a problem in prior art that an internal step shape is formed between a resin-layer sidewall and a passivation-layer sidewall of a via hole after the via hole is formed, and fracture of a pixel electrode and degradation of yield of products occur accordingly is solved. Thus, the quality of the display device is improved greatly.

Further, at the bottom of the via hole 53, there is a component 533. The component 533 may include a drain electrode of a TFT, a gate line leading wire or a data line leading wire, but is not limited thereto. In addition, a conductive layer 54 may be filled into the via hole 53, and is connected to the component 533 at the bottom of the via hole 53. The conductive layer 54, for example, may include a pixel electrode, but is not limited thereto. Because the sidewall 531 at the resin layer and the sidewall 532 at the passivation layer smoothly adjoin, the conductive layer 54 can be prevented from being fractured.

It is to be noted that the array substrate may include a pixel region and a peripheral leading wire region. In addition, the array substrate may further include a thin film transistor, a gate line leading wire, a data line leading wire and so on under the passivation layer 51. The via hole 53 may be a via hole located in the pixel region, and may also be a via hole located in the peripheral leading wire region. When the via hole 53 is a via hole located in the pixel region, the component 533 at the bottom of the via hole 53 may be a drain electrode of the TFT; and when the via hole 53 is a via hole located in the peripheral leading wire region, the component 533 at the bottom of the via hole 53 may be the gate line leading wire or the data line leading wire.

According to an embodiment of the present invention, there is provided a display device, which may be a TFT-LCD or an OLED display device. The display device comprises the TFT array substrate as stated above.

The display device may further comprise a counter substrate opposed to the array substrate. When the display device is a TFT-LCD, the counter substrate may be a color filter substrate, and a liquid crystal layer is enclosed between the array substrate and the color filter substrate.

The structure of the array substrate has been described in detail earlier, so it will no longer be explained here.

The sidewall at the resin layer and the sidewall at the passivation layer for the via hole on the TFT array substrate of the display device provided by the embodiment of the invention smoothly adjoin, a pixel electrode formed in the via hole can be prevented from being fractured. Thus, the yield of products is enhanced and the quality of the display device is improved.

In the specification, regarding smooth adjoining of the above sidewall at the resin layer and the sidewall at the passivation layer, it means that an aperture of the via hole at an upper surface of the passivation layer is substantially equal to an aperture of the via hole at a lower surface of the resin layer, that is, an edge of the via hole at the upper surface of the passivation substantially coincides with an edge of the via hole at the lower surface of the resin layer. Thus, no obvious step shape will occur at the junction of the sidewall at the resin layer and the sidewall at the passivation layer for the via hole.

In the forgoing embodiments, a via hole needed for connection between a pixel electrode and an underlying part is described as an example, however, embodiments of the invention are not limited to the via hole for the pixel electrode, and a via hole for any other use may be possible. According to embodiments of the invention, an undercut problem occurring upon formation of a via hole in a double-layered stack with different etch rates can be solved, and layers in the stack are not limited to the passivation layer and the resin layer as stated above, either. Rather, they can be applied to such cases that via holes are to be formed in various stacks, for which, etch rate of an upper layer is smaller than etch rate of a lower layer.

Based on the forgoing descriptions, at least the following methods and structures can be provided according to embodiments of the invention:

(1) A method for manufacturing a thin film transistor array substrate, comprising:

forming a passivation layer and a resin layer on a substrate in sequence;

removing a part of the resin layer through a patterning process, so as to form a resin-layer via hole passing through the resin layer;

etching the passivation layer under the resin-layer via hole, so as to form a via hole passing through the resin layer and the passivation layer;

treating the via hole with an etching process, so that a sidewall at the resin layer and a sidewall at the passivation layer for the via hole smoothly adjoin.

(2) The method in accordance with (1), wherein, a dry etching with an etch gas including a fluorine containing gas and an oxygen gas is used for the etching of the passivation layer under the resin-layer via hole, and mass of the oxygen gas is smaller than or equal to mass of the fluorine containing gas.

(3) The method in accordance with (2), wherein, in the dry etching of the passivation layer under the resin-layer via hole, mass ratio of the oxygen gas to the fluorine containing gas is in the range of 1:3-1:1.

(4) The method in accordance with any of (1) to (3), wherein, an ashing process with an etch gas including a fluorine containing gas and an oxygen gas is used for the treatment of the via hole with the etching process, and mass of the oxygen gas is larger than mass of the fluorine containing gas.

(5) The method in accordance with (4), wherein, in the process of treating the via hole with the etching process, mass ratio of the oxygen gas to the fluorine containing gas is in the range of 15:1-25:1.

(6) The method in accordance with any of (1) to (5), wherein, the resin layer adopts a photosensitive resin material;

the formation of the resin-layer via hole includes: the resin layer being subjected to an exposure and development process, so as to form the resin-layer via hole; and the residual resin at the resin-layer via hole being removed by using an ashing process.

(7) The method in accordance with (6), wherein, an etch gas used in the ashing process for removing the residual resin at the resin-layer via hole includes a fluorine containing gas and an oxygen gas, the flow rate of the fluorine containing gas is in the range of 20-100 sccm, the flow rate of oxygen gas is in the range of 500-1000 sccm, and mass ratio of oxygen gas to the fluorine containing gas is in the range of 8:1-12:1.

(8) The method in accordance with any of (1) to (5), wherein, the resin layer adopts a resin material which is not photosensitive;

the formation of the resin-layer via hole includes: the resin-layer hole being formed through etching by using a patterning process.

(9) The method in accordance with (3), wherein, the flow rate of the fluorine containing gas is in the range of 300-600 sccm, and the flow rate of the oxygen gas is in the range of 300-800 sccm.

(10) The method in accordance with (5), wherein, the flow rate of the fluorine containing gas is in the range of 20-200 sccm, and the flow rate of the oxygen gas is in the range of 500-2000 sccm.

(11) The method in accordance with any of (1) to (10), wherein, the array substrate includes a pixel region and a peripheral leading wire region, and the via hole is disposed in the pixel region and/or the peripheral leading wire region.

(12) A thin film transistor array substrate, comprising:
a substrate;
a passivation layer and a resin layer stacked on the substrate in sequence, wherein, in the passivation layer and the resin layer, there is a via hole passing through the passivation layer and the resin layer, and a sidewall at the resin layer and a sidewall at the passivation layer for the via hole smoothly adjoin.

(13) The array substrate in accordance with (12), wherein, an aperture of the via hole at an upper surface of the passivation layer is substantially equal to an aperture of the via hole at a lower surface of the resin layer.

(14) The array substrate in accordance with (12) or (13), further comprising a thin film transistor, a gate line leading wire, and a data line leading wire which are located under the via hole.

(15) A display device, comprising the array substrate as stated in any item of (12) to (14).

The foregoing are merely specific embodiments of the present invention, but the protection scope of the invention is not limited thereto. All changes or replacements, as would be conceived by those skilled in the art easily within the technical scope disclosed by the invention, shall come within the protection scope of the invention. Therefore, the protection scope of the invention shall be defined by the protection scope of the claims.

What is claimed is:

1. A method for manufacturing a thin film transistor array substrate, comprising:
forming a passivation layer and a resin layer on a substrate in sequence, wherein, the resin layer adopts a photosensitive resin material;
removing a part of the resin layer through a patterning process, so as to form a resin-layer via hole passing through the resin layer, the formation of the resin-layer via hole includes:
the resin layer being subjected to an exposure and development process, so as to form the resin-layer via hole; and
the residual resin at the resin-layer via hole being removed by using an ashing process,
wherein, an etch gas used in the ashing process for removing the residual resin at the resin-layer via hole includes a fluorine containing gas and an oxygen gas, and the flow rate of the fluorine containing gas is in the range of 20-100 sccm, the flow rate of oxygen gas is in the range of 500-1000 sccm, and mass ratio of the oxygen gas to the fluorine containing gas is in the range of 8:1-12:1;
etching the passivation layer under the resin-layer via hole, so as to form a via hole passing through the resin layer and the passivation layer;
treating the via hole with an etching process, so that a sidewall at the resin layer and a sidewall at the passivation layer for the via hole smoothly adjoin,
wherein, a dry etching with an etch gas including a fluorine containing gas and an oxygen gas is used for the etching of the passivation layer under the resin-layer via hole, and mass of the oxygen gas is smaller than or equal to mass of the fluorine containing gas,
wherein, in the dry etching of the passivation layer under the resin-layer via hole, mass ratio of the oxygen gas to the fluorine containing gas is in the range of 1:3-1:1, and the flow rate of the fluorine containing gas is in the range of 300-600 sccm, and the flow rate of the oxygen gas is in the range of 300-800 sccm; and
wherein, an ashing process with an etch gas including a fluorine containing gas and an oxygen gas is used for the treatment of the via hole with the etching process, and mass of the oxygen gas is larger than mass of the fluorine containing gas, wherein, in the process of treating the via hole with the etching process, mass ratio of the oxygen gas to the fluorine containing gas is in the range of 15:1-25:1, and the flow rate of the fluorine containing gas is in the range of 20-200 sccm and the flow rate of the oxygen gas is in the range of 500-2000 sccm.

* * * * *